May 30, 1961 R. W. SELBMANN 2,986,632
COMBINED OSCILLATOR CONVERTER CIRCUIT FOR HIGH FREQUENCIES
Filed March 17, 1959
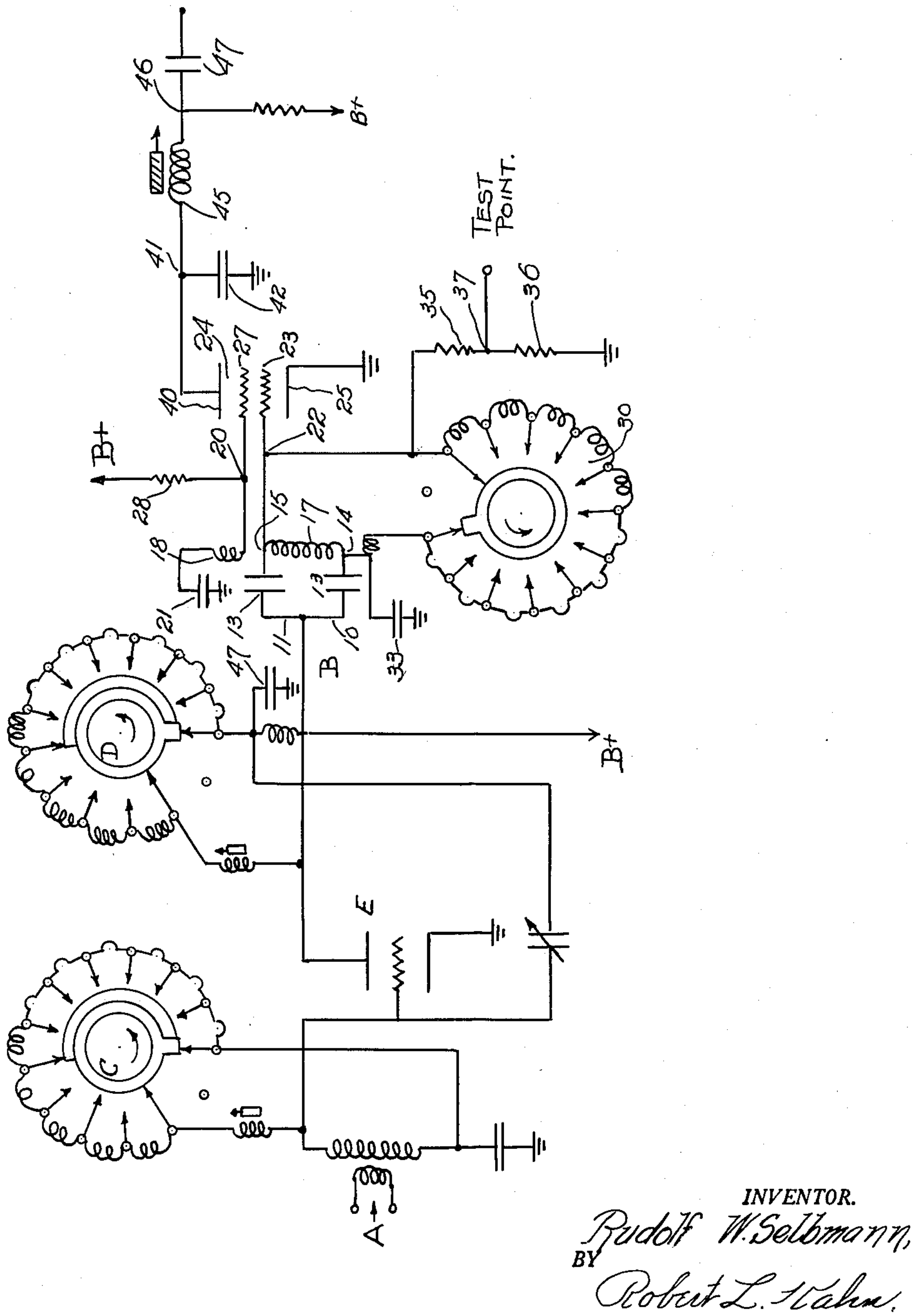
INVENTOR.
Rudolf W. Selbmann,
BY Robert L. Kahn.
Attorney.

2,986,632

COMBINED OSCILLATOR CONVERTER CIRCUIT FOR HIGH FREQUENCIES

Rudolf W. Selbmann, Jamaica, N.Y., assignor to Oak Manufacturing Co., a corporation of Delaware Filed Mar. 17, 1959, Ser. No. 799,894

3 Claims. (Cl. 250—20)

This invention relates to a combined oscillator and converter circuit for high frequencies. More particularly the invention relates to a circuit which facilitates combined oscillator-mixer functions in a single section of a vacuum tube or equivalent transistor device in a tuner for the VHF (very high frequency) band used in television in the United States ranging from channel 2 up to and including channel 13.

As is well-known, the tuner of most television signal receivers operates in a system utilizing a superheterodyne principle whereby the desired signal frequencies are mixed with a local oscillator frequency to produce a useful output in a desired intermediate frequency band, normally referred to as the IF band.

Due to the wide range of signal frequencies embodied in television VHF spectrum, it has been customary TV tuner practice to have a first section of a dual section vacuum tube devoted exclusively to generating oscillations and a second, separate and distinct section of said tube function as a mixer or converter for combining TV channel frequencies and oscillator frequencies to produce desired intermediate frequencies, or IF output.

Where a frequency spectrum is not extensive—and this is true for the frequency modulated band of frequencies of 88–108 megacycles as used in the United States—it has been possible to have one triode, with IF neutralizing means, serve as a combined oscillator-mixer for accomplishing both the generation of necessary oscillations and the mixing thereof with desired incoming signal frequencies to produce a useful IF output. The general use of an IF neutralized triode for this purpose is possible due to the availability of triodes with high transconductance in the order of 10,000 micro-mhos which rapidly permits sustained oscillations as well as reasonable signal conversion efficiency.

However, there are some disadvantages in the use of a triode. The disadvantages include the necessity of IF neutralizing, and in addition there is the relatively low triode plate resistance ($R_p$) which tends to load the IF output circuit and reduce gain.

Where the overall frequency spectrum to be received is quite extensive and the IF is close to one end of the desired signal frequency range, the proper maintenance of all the necessary functions of an oscillating mixer creates serious difficulties. These arise out of the great dynamic loading variations which occur due to the inherent inductance and capacitance in vacuum tubes. Such great loading variations impose extreme difficulties in the use of a relatively simple single tube mixer and oscillator for TV tuners. The same problem is encountered in a transistor design.

Inductive reactance increases directly with frequency while capacitive reactance changes inversely with frequency. As frequency changes, the combined inductive and capacitive impedance of various circuit elements, including the electrodes of the vacuum tube itself, change. As changes in such impedance values occur with change in frequency, the electronic loading as well as the amount of feedback in an oscillating circuit will change greatly over the wide frequency spectrum of the VHF TV channels. This variation has generally necessitated a separate tube with Gm capable of sustaining oscillations over said wide frequency range. Consequently, substantially all TV receivers have used vacuum tube oscillator sections which are separate and distinct from the mixer tube sections; although for convenience both may be disposed in the same envelope.

This invention provides a simple and effective circuit whereby a tetrode or pentode vacuum tube section may be utilized for both the generation of oscillations and the mixing of signal and oscillator frequencies over the entire range of VHF TV spectrum. The tetrode or pentode eliminates the necessity for IF neutralizing and also decreases the IF plate circuit loading. The invention can be used advantageously in other wide frequency ranges and narrow frequency range tuner applications.

The invention in general utilizes an oscillator having inductive feedback in a tetrode or pentode tube. The inductive feedback couples the cathode-screen circuit to the cathode-control grid circuit in proper phase for maintaining oscillations. The invention contemplates a cathode-control grid circuit of such character that a signal input point may be found, which point can satisfy two conditions:

(*a*) The potential of said point insofar as oscillations are concerned is substantially a minimum or null, and (*b*) The null point insofar as a signal frequency is concerned is connected to the control grid by a low impedance path.

A transformer, which has close coupling between the primary (connected to the control grid) and secondary (connected to the screen), maintains oscillator feedback. The transformer primary provides such a null point. Access to the null point is provided by capacitive potential dividing means connected across the primary.

The transformer arrangement functions efficiently over the entire VHF range and permits the use, in either tetrodes or pentodes, of a screen electrode with relatively low Gm to serve as the equivalent of the anode of a high Gm triode oscillator. The circuit arrangement also eliminates the interaction of IF output tuning with the signal frequency tuning without resorting to a critical IF neutralizing scheme.

In order that the invention may be fully understood, reference will now be made to the drawing showing a circuit illustrating the invention.

Between antenna input A and point B conventional tuning and amplifying means may be provided for handling desired signal channels such as, for example, TV channels 2 to 13 inclusive. As illustrated here, generally conventional switch tuning sections C and D are provided. In this case a conventional neutralized triode RF amplifier E is interposed between tuning sections. This amplifier can be a tetrode, pentode or any other well known form of amplifier tube or device.

The output of tuning section D is fed to point B and constitutes amplified television signals in a particular channel. While a switch-type tuner is illustrated for providing signals to B, it is understood that this is merely exemplary and other types of tuners, such as turret or continuous type tuners, may be used. It is also understood that the antenna input A may be directly connected to point B through a proper matching means. So far the system is conventional.

Beginning with junction B, the signal channel is fed by wires 10 and 11 through capacitors 12 and 13 to junction points 14 and 15 respectively. Between junction points 14 and 15 there is disposed primary 17 of a transformer having secondary 18. The transformer ratio between primary 17 and secondary 18 is somewhat greater than one. The primary and secondary are preferably wound in bifilar relation. It is understood that transformers with windings other than in bifilar relation may be employed so long as proper coupling is maintained. Insofar as transformer windings 17 and 18 are concerned, these windings and their coupling are governed by conventional oscillator design requirements. Such requirements involve tube characteristics, circuit parameters and the like. Thus, one skilled in the art can readily design the transformer after a tube has been selected. In fact, sometimes an oscillator circuit is designed for a special tube.

Secondary 18 has one terminal connected to junction 20 and has the other terminal returned to ground through capacitor 21. The polarity of connections is important since proper phasing of the transformer output is essential for efficient oscillation.

Referring to primary 17, junction 15 is connected to junction 22 and this in turn is connected to control grid 23 of vacuum tube 24. Vacuum tube 24 has cathode 25 grounded. Vacuum tube 24 has screen grid 27 connected to junction 20, this latter junction being connected through suitable load resistor 28 to B plus. It is understood that cathode 25 will have a heater for energizing the same.

Between terminal 14 of transformer winding 17 and junction point 22, there is connected oscillator switch tuner section 30. Terminal 14 is returned to ground through capacitor 33. Capacitors 21 and 33 in general will have generally about equal values (21 may tend to be a bit smaller) and these will be substantially smaller than capacitors 12 and 13. Oscillator switch tuner section 30 is of conventional design and may be replaced by other oscillator tuning means such as are used in turret tuners or continuous type tuners. Junction 22 is also connected to ground through resistors 35 and 36 between which test point 37 is provided.

Referring to vacuum tube 24, anode 40 is connected to junction 41. The desired IF frequencies are fed from junction 41 through output winding 45 forming part of a conventional IF coupling system. Thus, coil 45, which in practice may have a powdered iron core, is connected to junction point 46 and this junction in turn feeds its output through capacitor 47 to the remaining part of a TV receiver. Junction 46 is also connected through load resistor 48 to a B plus source of potential.

Transformer winding 17 in this example is shunt tuned by oscillator tuning section 30 for selecting the desired operating frequency. It is understood that other types of tuning, such as "series tuning," may also be employed with properly designed transformers. So long as suitable tuning means and transformers are provided, it makes little difference whether the oscillator section is tuned by switching or by continuous variation of either inductance or capacity or both. In general, a control for the oscillator tuning section may be operated simultaneously with the tuning controls for tuning sections C and D so that one manual control only need be actuated.

Between control grid 23 and cathode 25 there exists the oscillator alternating voltage. The means for maintaining this oscillation includes transformer windings 17 and 18 and the tuning element, switch tuning section 30, in conjunction with capacitor 33 and 21 and the mutual capacities between the tube electrodes 25, 23, 27. As is well known, a coil or winding such as 17, at resonance, will have a 180° phase shift between opposite ends (15 and 14 in this circuit). It follows that there is a point of zero or minimum R.F. potential with respect to ground on this coil between the terminals. Capacitors 12 and 13 are so selected in value as to function as a voltage divider to locate point B at or close to the zero or minimum oscillator potential point with respect to ground.

Generally, capacitors 12 and 13 should be large enough to have low impedance for the signal frequencies from amplifier E. For TV purposes, capacitors 12 and 13 will be in the mmf. range and will be of the same order of magnitude. These values will be larger than the interelectrode capacitances of tube 24.

When point B is at or close to zero potential with respect to ground for oscillator potentials, there will be a minimum of oscillator energy appearing between point B and ground. This desirable condition minimizes the propagation of oscillator energy backwards toward the antenna through amplifier tube E and its associated circuits. This desirable condition also minimizes any interaction between the oscillator tuning means and the preceding amplifier and tuning section D and its associated tuning elements.

The condition of balance at junction B may be tested by temporarily connecting a bypass capacitor from junction B to ground. With proper balance condition, the oscillator will be substantially unaffected.

Due to the fact that transformer windings 17 and 18 are closely coupled, have proper turns ratio and are properly phased, and capacitors 21 and 33 are in proper relation, there will be sufficient feedback between screen grid 27 and control grid 23 to maintain adequate oscillation over a desired frequency spectrum. This highly desirable result makes for good uniform tuner performance.

At the selected signal or channel frequencies, as distinguished from oscillator frequencies, there is a potential difference between junction B and ground. This signal energy is transmitted equally in phase on one hand to primary terminal 15 through capacitor 13 and on the other hand to primary terminal 14 through capacitor 12. Even though signal energy is impressed on primary terminals 15 and 14 there is substantially no signal potential across transformer primary winding 17. Signal energy appears between control grid 23 and grounded cathode 25 of tube 24 on one hand and between primary terminal 14 and ground on the other.

The capacitive reactance from junction B to ground at signal frequencies is included in the total capacitance resonantly tuned by the inductances associated with tuning section D. It is thus clear that tuning section D really includes capacitors 12 and 33.

Tube 24 can now function as a conventional mixer. Between control grid 23 and cathode 25, tuned signal potentials derived from A appear. Between screen grid 27 and cathode 25 oscillator output potentials appear. Across anode 40 and cathode 25 appear potentials corresponding to various frequencies which represent the sum and difference frequency components of the oscillator and desired signal frequencies. The output circuit of tube 24 is tuned to select the desired mixer frequency.

As an example, the oscillator frequency may range from 100 to 260 megacycles for operating over TV channels 2 to 13 inclusive. The mixer output at junction 41 will range from about 41.25 megacycles to about 45.75 megacycles. This, of course, may be varied depending upon IF amplifier characteristics.

A typical transformer for TV operation has seven turns for winding 17 and four turns for winding 18, both windings being of number 30 wire closely wound on a 7/32" O.D. form having a 1/4" powdered iron core. Capacitors 12 and 13 can be each about 10 mmf. while capacitor 21 can be about 5 mmf. Vacuum tube 24 may be a section similar in electrical characteristics to the 6CY5 type. Capacitor 33 is about 6.8 mmf. Due caution customary in TV work must be exercised in lead lengths of components and hookup to insure proper operating characteristics.

The exact design of transformer windings 17 and 18 will depend upon the operating characteristics of the amplifier, in this instance, vacuum tube 24. The number of turns of each winding will also be determined in some measure by the values of capacitors 21 and 33.

If a pentode is used, instead of a tetrode, for amplifier 24, the extra suppressor grid located between screen grid 27 and anode 40 will be connected to cathode 25.

The oscillator circuit involving transformer primary 17 can be series tuned rather than shunt tuned as illustrated. This can be accomplished by disconnecting tuning section 30 from transformer terminal 14 and connecting the tuning section terminal to primary terminal 15. Primary terminal 15 is disconnected from the grid lead. Thus, the grid circuit from junction 22 goes through tuning section 30 to terminal 15 through primary 17 to terminal 14 and to grounded capacitor 33. Resistors 35 and 36 and capacitors 12 and 13 remain as is.

In connection with such series tuned arrangement, transformer primary 17 would have its turns reduced since it would be feeding a relatively low impedance point of the total grid circuit. Capacitors 12, 13 and 33 would still remain where they are but their values would have to be changed.

Fundamentally, the functions of capacitors 21 and 33 are to provide for balancing the transformer in the circuit so that undesired feedback will not occur. Such balancing procedure must take into account not only the inductance and distributed capacitance of the transformer windings but must also consider the wiring leads, tube capacitances and the nature of the ground connections. It may, for example, be possible to interchange the positions of capacitor 21 and secondary 18 in which case some change in their values would result.

In connection with capacitors 12 and 13, these, together with their connecting leads, do have certain capacitances to ground which play some part. However, by suitable choice of the relative values of these capacitors, whether transformer primary 17 is shunt tuned or series tuned, it will be possible to locate point B so that its potential for oscillator energy is at a minimum with reference to ground.

It is possible to apply this invention to a triode type of combined oscillator and mixer. In such case, screen grid 27 and anode 40 would be merged into one anode, all but one of the remaining connections being the same. This one exception would be resistor 28 and the B plus connection which, of course, would no longer be necessary. It is understood that even as illustrated in the circuit with a four-electrode tube, that the screen grid is an anode.

What is claimed is:

1. A combined oscillator and mixer system capable of sustained operation at high efficiency in a superheterodyne type of signal receiver for handling signal frequencies covering the VHF frequency range of TV channels 2 to 13 inclusive, said system comprising an amplifier having at least a grounded cathode, control grid, screen grid and anode, means for impressing positive potentials on the screen grid and anode with the negative potential connected to ground, a radio frequency transformer having primary and secondary windings in closely coupled relation with the primary having more turns than the secondary to provide step-down action, a first capacitor connected between one terminal of said secondary and ground, a wire connection from the other terminal of said secondary to the screen grid, second and third capacitors connected in series across the primary winding to provide potential dividing means, a terminal between said last named two capacitors for receiving input TV signals consisting of a modulated carrier, said terminal feeding signals through the potential dividing capacitors to both terminals of the primary winding, a fourth capacitor connected between a terminal of the primary and ground, said first and fourth capacitors being each larger than the potential dividing second and third capacitors, a variable oscillator tuning section, means for connecting said tuning section and primary winding between said control grid and ground, the capacitances of each of the second and third capacitors being larger than the inter-electrode capacitances of the amplifier, said transformer windings being properly poled so that oscillations may be maintained, said input terminal for signal frequencies having a path for signal frequencies which has a low impedance to the control grid, the first and fourth capacitors balancing the transformer to minimize undesired feed-back toward the signal source, said signal return being grounded.

2. The system according to claim 1 wherein said oscillator tuning section is in shunt to the primary winding.

3. The system according to claim 2 wherein the transformer windings are in bifilar relation.

References Cited in the file of this patent

UNITED STATES PATENTS

| | | |
|---|---|---|
| 1,560,854 | Pressley | Nov. 10, 1925 |
| 1,962,104 | Harnett | June 5, 1934 |
| 2,808,505 | Cantz | Oct. 1, 1957 |

FOREIGN PATENTS

| | | |
|---|---|---|
| 184,216 | Austria | December 1955 |